US012620434B2

(12) United States Patent
Lu et al.

(10) Patent No.: US 12,620,434 B2
(45) Date of Patent: May 5, 2026

(54) TIME-VARYING THRESHOLD FOR USAGE-BASED DISTURBANCE MITIGATION

(71) Applicant: Micron Technology, Inc., Boise, ID (US)

(72) Inventors: Yang Lu, Boise, ID (US); Yuan He, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 105 days.

(21) Appl. No.: 18/659,305

(22) Filed: May 9, 2024

(65) Prior Publication Data

US 2024/0379148 A1      Nov. 14, 2024

Related U.S. Application Data

(60) Provisional application No. 63/501,895, filed on May 12, 2023.

(51) Int. Cl.
*G11C 11/4078*        (2006.01)
*G11C 11/406*        (2006.01)
*G11C 11/4076*        (2006.01)

(52) U.S. Cl.
CPC .... *G11C 11/4078* (2013.01); *G11C 11/40615* (2013.01); *G11C 11/4076* (2013.01)

(58) Field of Classification Search
CPC .......... G11C 11/4078; G11C 11/40615; G11C 11/4076
USPC ..................................................... 365/185.05
See application file for complete search history.

(56) References Cited

U.S. PATENT DOCUMENTS

2019/0066808 A1 *    2/2019   Nale ..................... G11C 11/406

* cited by examiner

*Primary Examiner* — Huan Hoang
(74) *Attorney, Agent, or Firm* — Colby Nipper PLLC

(57)        ABSTRACT

Apparatuses and techniques for implementing aspects of a time-varying threshold for usage-based disturbance mitigation. In an example aspect, usage-based disturbance circuitry of a memory device utilizes a threshold that varies over time for detecting conditions associated with usage-based disturbance. By utilizing the time-varying threshold, the usage-based disturbance circuitry can reduce a probability of a waterfall event causing a denial-of-service (DOS) situation. In particular, the time-varying threshold can spread out the refreshing of rows over a longer time period. This enables the memory device to have sufficient resources to service other memory requests while also mitigating usage-based disturbance. In example implementations, the threshold is at least partially randomized, which can make it challenging for a malicious actor to identify and overcome the usage-based disturbance mitigation techniques. Also, techniques for generating the time-varying threshold can be implemented without appreciably increasing a size or cost of the memory device.

20 Claims, 8 Drawing Sheets

100

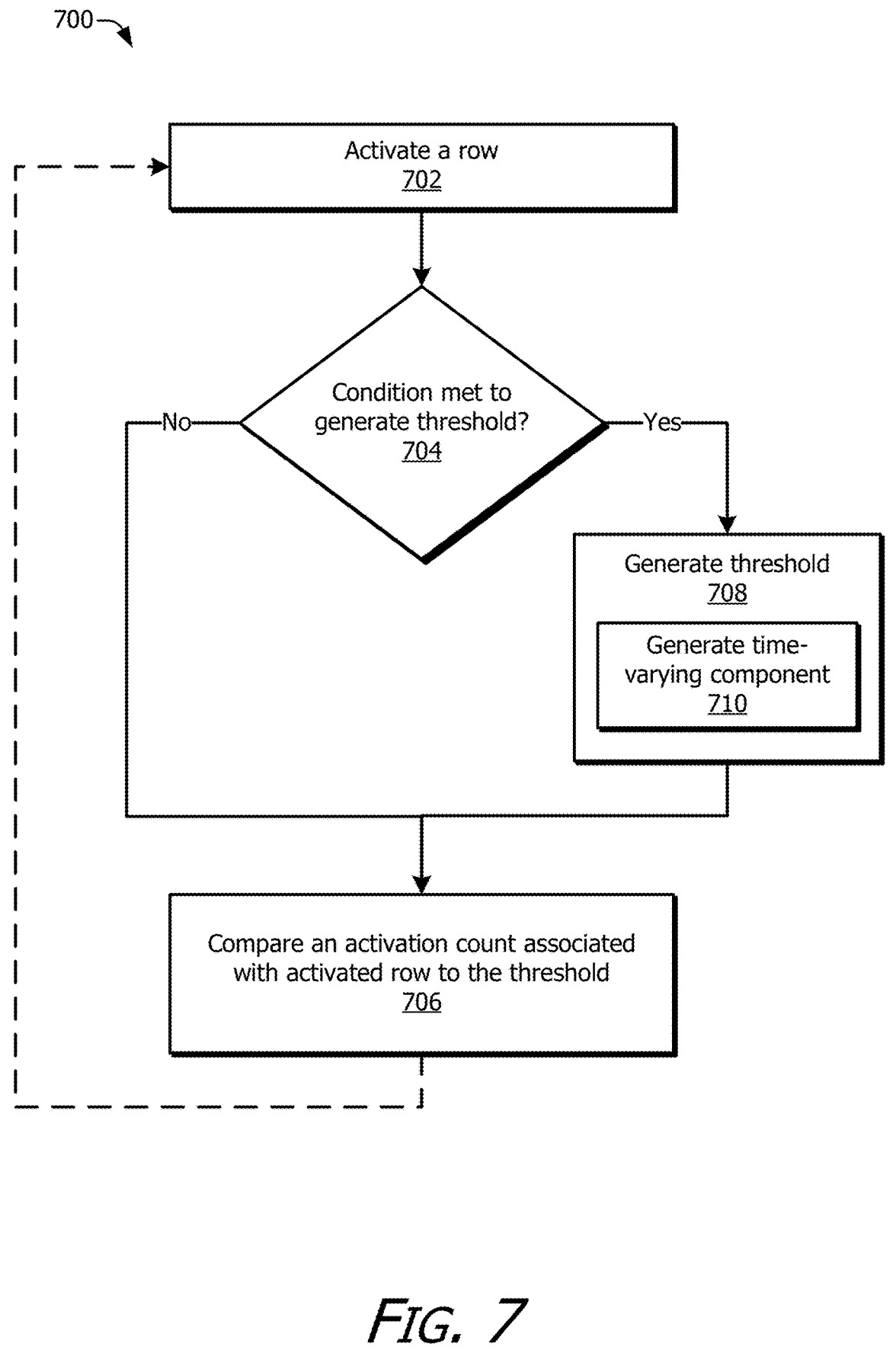

700

Activate a row
702

Condition met to
generate threshold?
704

No

Yes

Generate threshold
708

Generate time-
varying component
710

Compare an activation count associated
with activated row to the threshold
706

*FIG. 7*

Store, by a memory array, an activation
count that represents a quantity of times a row
within the memory array has been activated
802

Generate, by circuitry, a threshold that varies over time
804

Detect, by the circuitry, a condition associated with
usage-based disturbance based on the activation
count being greater than or equal to the threshold
806

TIME-VARYING THRESHOLD FOR USAGE-BASED DISTURBANCE MITIGATION

CROSS-REFERENCE TO RELATED APPLICATION(S)

This application claims the benefit of U.S. Provisional Patent Application Ser. No. 63/501,895 filed on May 12, 2023, the disclosure of which is incorporated by reference herein in its entirety.

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and non-volatile memory (e.g., flash memory). Like the capabilities of a processor, the capabilities of a memory can impact the performance of an electronic device. This performance impact can increase as processors are developed that execute code faster and as applications operate on increasingly larger data sets that require ever-larger memories.

BRIEF DESCRIPTION OF THE DRAWINGS

Apparatuses of and techniques for implementing aspects of a time-varying threshold for usage-based disturbance mitigation are described with reference to the following drawings. The same numbers are used throughout the drawings to reference like features and components:

FIG. 7 illustrates another example flow diagram for performing aspects of generating a time-varying threshold for usage-based disturbance mitigation.

DETAILED DESCRIPTION

Overview

Figure 1:
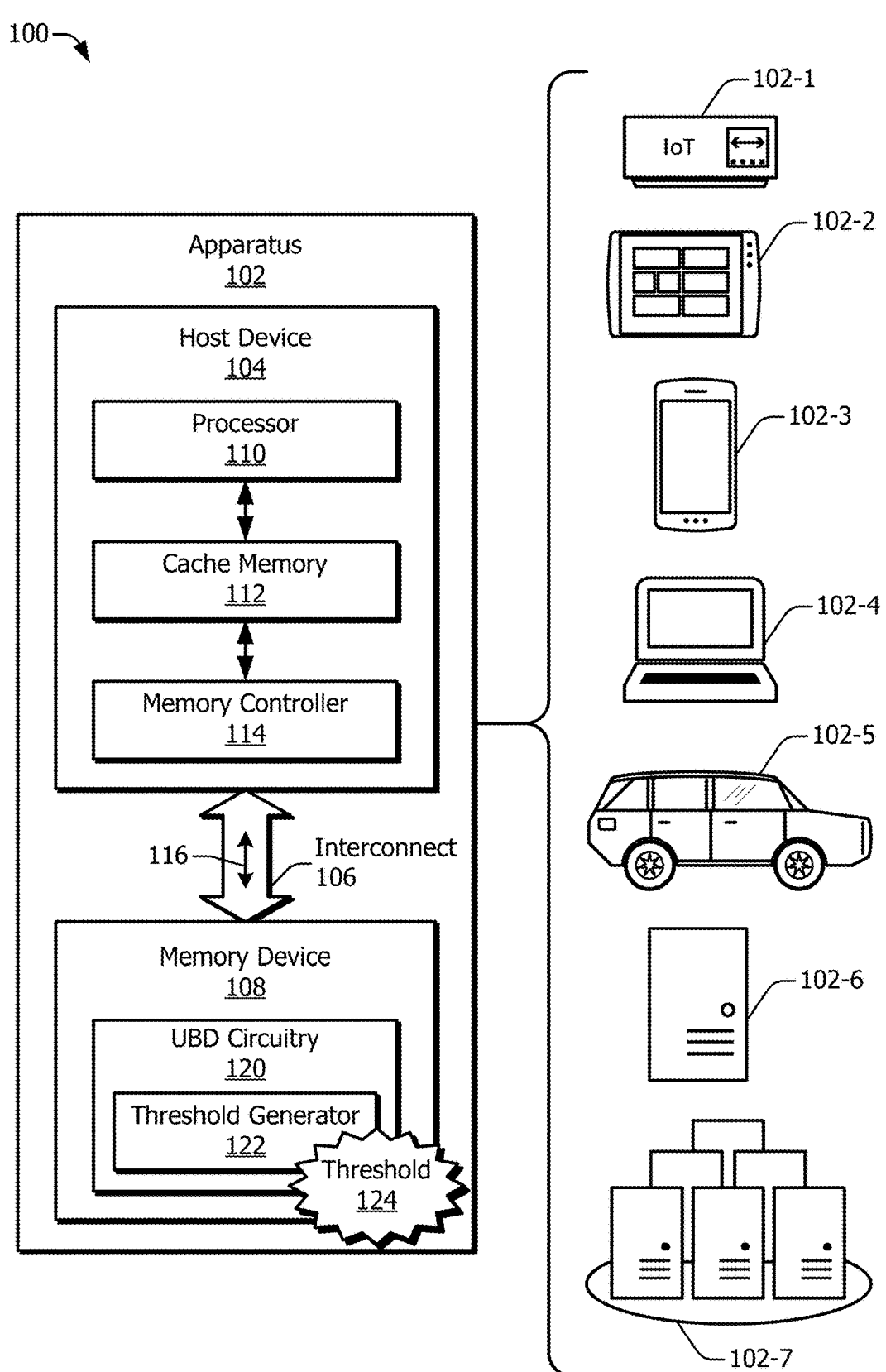
FIG. 1 illustrates example apparatuses that can implement aspects of a time-varying threshold for usage-based disturbance mitigation.

Processors and memory work in tandem to provide features to users of computers and other electronic devices. As processors and memory operate more quickly together in a complementary manner, an electronic device can provide enhanced features, such as high-resolution graphics and artificial intelligence (AI) analysis. Some applications, such as those for financial services, medical devices, and advanced driver assistance systems (ADAS), can also demand more-reliable memories. These applications use increasingly reliable memories to limit errors in financial transactions, medical decisions, and object identification. However, in some implementations, more-reliable memories can sacrifice bit densities, power efficiency, and simplicity.

To meet the demands for physically smaller memories, memory devices can be designed with higher chip densities. Increasing chip density, however, can increase the electromagnetic coupling (e.g., capacitive coupling) between adjacent or proximate rows of memory cells due, at least in part, to a shrinking distance between these rows. With this undesired coupling, activation (or charging) of a first row of memory cells can sometimes negatively impact a second nearby row of memory cells. In particular, activation of the first row can generate interference, or crosstalk, that causes the second row to experience a voltage fluctuation. In some instances, this voltage fluctuation can cause a state (or value) of a memory cell in the second row to be incorrectly determined by a sense amplifier. Consider an example in which a state of a memory cell in the second row is a "1". In this example, the voltage fluctuation can cause a sense amplifier to incorrectly determine the state of the memory cell to be a "0" instead of a "1". Left unchecked, this interference can lead to memory errors or data loss within the memory device.

In some circumstances, a particular row of memory cells is activated repeatedly in an unintentional or intentional (sometimes malicious) manner. Consider, for instance, that memory cells in an $R^{th}$ row are subjected to repeated activation, which causes one or more memory cells in an adjacent row (e.g., within an R+1 row, an R+2 row, an R−1 row, and/or an R−2 row) to change states. This effect is referred to as usage-based disturbance. The occurrence of usage-based disturbance can lead to the corruption or changing of contents within the affected row of memory.

Some memory devices monitor how often a row of memory cells is activated and refresh nearby rows to mitigate usage-based disturbance if the activation count exceeds a fixed threshold. In some situations, however, a waterfall event can activate a set of rows multiple times to cause the activation counts of these rows to exceed the fixed threshold within a relatively short time window. Consequently, the memory device may become too busy mitigating usage-based disturbance due to the waterfall event to be able to service read and/or write requests. This results in a denial-of-service (DOS) situation, which makes the memory device inaccessible to the memory controller and the user.

To address this and other issues regarding usage-based disturbance, this document describes a time-varying threshold for usage-based disturbance mitigation. In an example aspect, usage-based disturbance circuitry of a memory device utilizes a threshold that varies over time for detecting conditions associated with usage-based disturbance. By utilizing the time-varying threshold, the usage-based disturbance circuitry can reduce a probability of a waterfall event causing a denial-of-service (DOS) situation. In particular, the time-varying threshold can spread out the refreshing of rows over a longer time period. This enables the memory device to have sufficient resources to service other memory requests while also mitigating usage-based disturbance. In example implementations, the threshold is at least partially randomized, which can make it challenging for a malicious actor to identify and overcome the usage-based disturbance mitigation techniques. Also, techniques for generating the time-varying threshold can be implemented without appreciably increasing a size or cost of the memory device.

Example Operating Environments

FIG. 1 illustrates, at 100 generally, an example operating environment including an apparatus 102 that can implement aspects of randomizing a threshold for usage-based disturbance mitigation. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure, a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit, graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus (e.g., a unidirectional or bidirectional bus), switching fabric, or one or more wires that carry voltage or current signals. The interconnect 106 can propagate one or more communications 116 between the host device 104 and the memory device 108. For example, the host device 104 may transmit a memory request to the memory device 108 over the interconnect 106. Also, the memory device 108 may transmit a corresponding memory response to the host device 104 over the interconnect 106.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a printed circuit board (e.g., a rigid or flexible motherboard). The host device 104 and the memory device 108 may additionally be integrated together on an integrated circuit or fabricated on separate integrated circuits and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 1 an example computing system architecture having at least one host device 104 coupled to a memory device 108.

Two or more memory components (e.g., modules, dies, banks, or bank groups) can share the electrical paths or couplings of the interconnect 106. The interconnect 106 can include at least one command-and-address bus (CA bus) and at least one data bus (DQ bus). The command-and-address bus can transmit addresses and commands from the memory controller 114 of the host device 104 to the memory device 108, which may exclude propagation of data. The data bus can propagate data between the memory controller 114 and the memory device 108. The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or a system-on-chip of the apparatus 102. The memory device 108 includes at least one instance of usage-based disturbance circuitry 120. The usage-based disturbance circuitry 120 monitors and mitigates usage-based disturbance for one or more banks associated with the memory device 108. The usage-based disturbance circuitry 120 can be implemented using software, firmware, hardware, fixed logic circuitry, or combinations thereof. An example implementation of the usage-based disturbance circuitry 120 is further described with respect to FIG. 4.

To reduce a probability of a waterfall event causing a denial-of-service situation, the usage-based disturbance circuitry 120 includes a threshold generator 122, which generates a threshold 124 that varies over time in a periodic or non-periodic manner. In example implementations, the threshold 124 is at least partially randomized. For example, the threshold generator 122 determines the threshold 124 based on a combination of a fixed component and a time-varying component, which are further described with respect to FIG. 4. Other implementations are also possible in which the threshold generator 122 selects the threshold 124 from a table of possible values. Various conditions can cause the threshold generator 122 to change a value of the threshold 124 over time, as further described with respect to FIGS. 6 and 7. With this time-varying threshold 124, the memory device 108 can realize a target power efficiency while performing usage-based disturbance mitigation techniques and avoiding a denial-of-service situation caused by a waterfall event. The usage-based disturbance circuitry 120 is further described with respect to FIG. 2.

Figure 2:
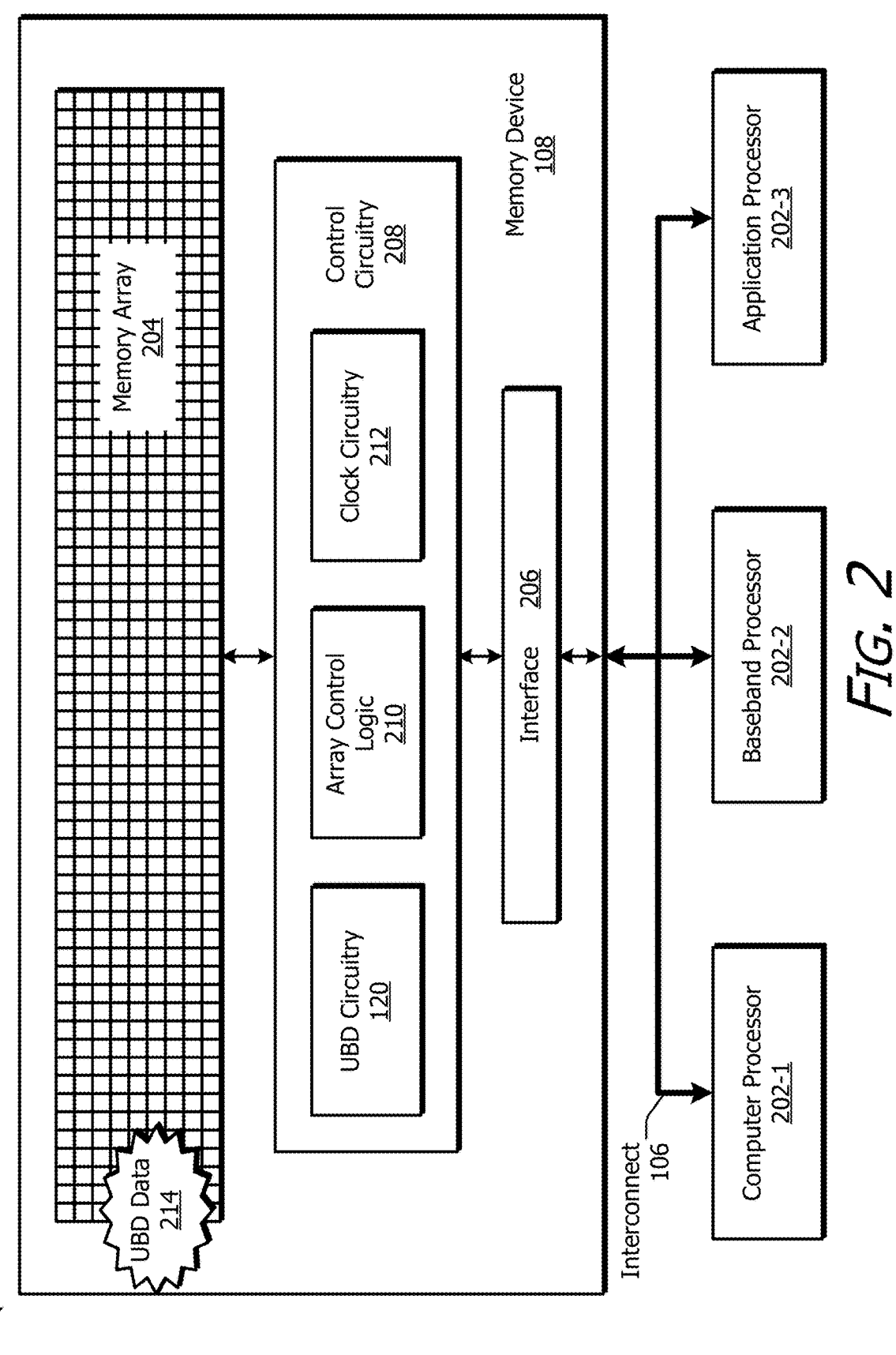
FIG. 2 illustrates an example computing system that can implement aspects of a time-varying threshold for usage-based disturbance mitigation.

FIG. 2 illustrates an example computing system 200 that can implement aspects of a time-varying threshold for usage-based disturbance mitigation. In some implementations, the computing system 200 includes at least one memory device 108, at least one interconnect 106, and at least one processor 202. The memory device 108 can include, or be associated with, at least one memory array 204, at least one interface 206, and control circuitry 208 (or periphery circuitry) operatively coupled to the memory array 204. The memory array 204 can include an array of memory cells, including but not limited to memory cells of DRAM, SDRAM, three-dimensional (3D) stacked DRAM, DDR memory, LPDDR SDRAM, and so forth. The memory array 204 and the control circuitry 208 may be components on a single semiconductor die or on separate semiconductor dies. The memory array 204 or the control circuitry 208 may also be distributed across multiple dies. This control circuitry 208 may manage traffic on a bus that is separate from the interconnect 106.

The control circuitry 208 can include various components that the memory device 108 can use to perform various operations. These operations can include communicating with other devices, managing memory performance, performing refresh operations (e.g., self-refresh operations or auto-refresh operations), and performing memory read or write operations. For example, the control circuitry 208 can include at least one instance of array control logic 210 and clock circuitry 212. The array control logic 210 can include circuitry that provides command decoding, address decoding, input/output functions, amplification circuitry, power supply management, power control modes, and other functions. The clock circuitry 212 can synchronize various memory components with one or more external clock signals provided over the interconnect 106, including a command-and-address clock or a data clock. The clock circuitry 212 can also use an internal clock signal to synchronize memory components and may provide timer functionality.

The memory device 108 also includes the usage-based disturbance circuitry 120. In some aspects, the usage-based disturbance circuitry 120 can be considered part of the control circuitry 208, as shown in FIG. 2. For example, the usage-based disturbance circuitry 120 can represent another part of the control circuitry 208. The usage-based disturbance circuitry 120 can be coupled to a set of memory cells within the memory array 204 that store usage-based disturbance data 214. The usage-based disturbance data 214 can include information such as an activation count, which represents a quantity of times one or more rows within the memory array 204 have been activated (or accessed) by the memory device 108.

In example implementations, each row of the memory array 204 includes a subset of memory cells that stores the usage-based disturbance data 214 associated with that row. For example, a first row includes a subset of memory cells that store a first activation count representing a quantity of times the first row has been activated. Additionally, a second row includes another subset of memory cells that store a second activation count representing a quantity of times the second row has been activated. Other implementations are also possible in which the activation count represents a quantity of activations associated with more than one row.

During memory operations, the usage-based disturbance circuitry 120 can perform operations based on the usage-based disturbance data 214. For example, the usage-based disturbance circuitry can monitor and update the activation count associated with an activated row. Example operations of the usage-based disturbance circuitry 120 are further described with respect to FIG. 4.

The interface 206 can couple the control circuitry 208 or the memory array 204 directly or indirectly to the interconnect 106. In some implementations, the usage-based disturbance circuitry 120, the array control logic 210, and the clock circuitry 212 can be part of a single component (e.g., the control circuitry 208). In other implementations, one or more of the usage-based disturbance circuitry 120, the array control logic 210, or the clock circuitry 212 may be implemented as separate components, which can be provided on a single semiconductor die or disposed across multiple semiconductor dies. These components may individually or jointly couple to the interconnect 106 via the interface 206.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address bus and a data bus.

In some aspects, the memory device 108 may be a "separate" component relative to the host device 104 (of FIG. 1) or any of the processors 202. The separate components can include a printed circuit board, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processor 202, by being combined on a printed circuit board or in a single package or a system-on-chip.

As shown in FIG. 2, the processors 202 may include a computer processor 202-1, a baseband processor 202-2, and an application processor 202-3, coupled to the memory device 108 through the interconnect 106. The processors 202 may include or form a part of a central processing unit, graphics processing unit, system-on-chip, application-specific integrated circuit, or field-programmable gate array. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices).

Example Techniques and Hardware

Figure 3:
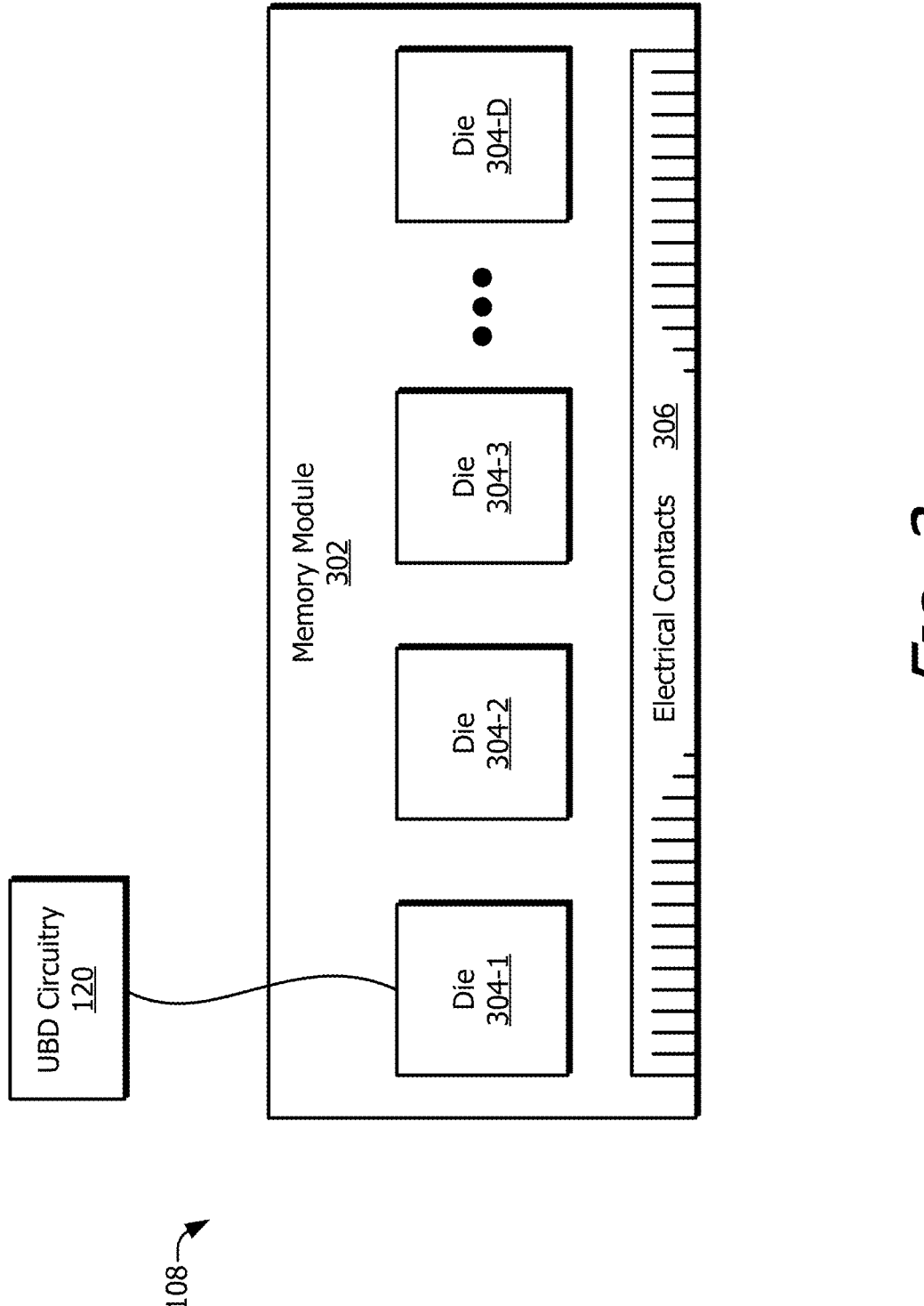
FIG. 3 illustrates an example memory device in which aspects of a time-varying threshold for usage-based disturbance may be implemented.

FIG. 3 illustrates an example memory device 108 in which aspects of a time-varying threshold for usage-based disturbance mitigation can be implemented. The memory device 108 includes a memory module 302, which can include multiple dies 304. As illustrated, the memory module 302 includes a first die 304-1, a second die 304-2, a third die 304-3, and a D$^{th}$ die 304-D, with D representing a positive integer. One or more of the dies 304-1 to 304-D include the usage-based disturbance circuitry 120.

The memory module 302 can be a SIMM or a DIMM. As another example, the memory module 302 can interface with other components via a bus interconnect (e.g., a Peripheral Component Interconnect Express (PCIe®) bus). The memory device 108 illustrated in FIGS. 1 and 2 can correspond, for example, to multiple dies (or dice) 304-1 through 304-D, or a memory module 302 with two or more dies 304. As shown, the memory module 302 can include one or more electrical contacts 306 (e.g., pins) to interface the memory module 302 to other components.

The memory module 302 can be implemented in various manners. For example, the memory module 302 may include a printed circuit board, and the multiple dies 304-1 through 304-D may be mounted or otherwise attached to the printed circuit board. The dies 304 (e.g., memory dies) may be arranged in a line or along two or more dimensions (e.g., forming a grid or array). The dies 304 may have a similar size or may have different sizes. Each die 304 may be similar to another die 304 or different in size, shape, data capacity, or control circuitries. The dies 304 may also be positioned on a single side or on multiple sides of the memory module 302. An example implementation of the usage-based disturbance circuitry 120 is further described with respect to FIG. 4.

Figure 4:
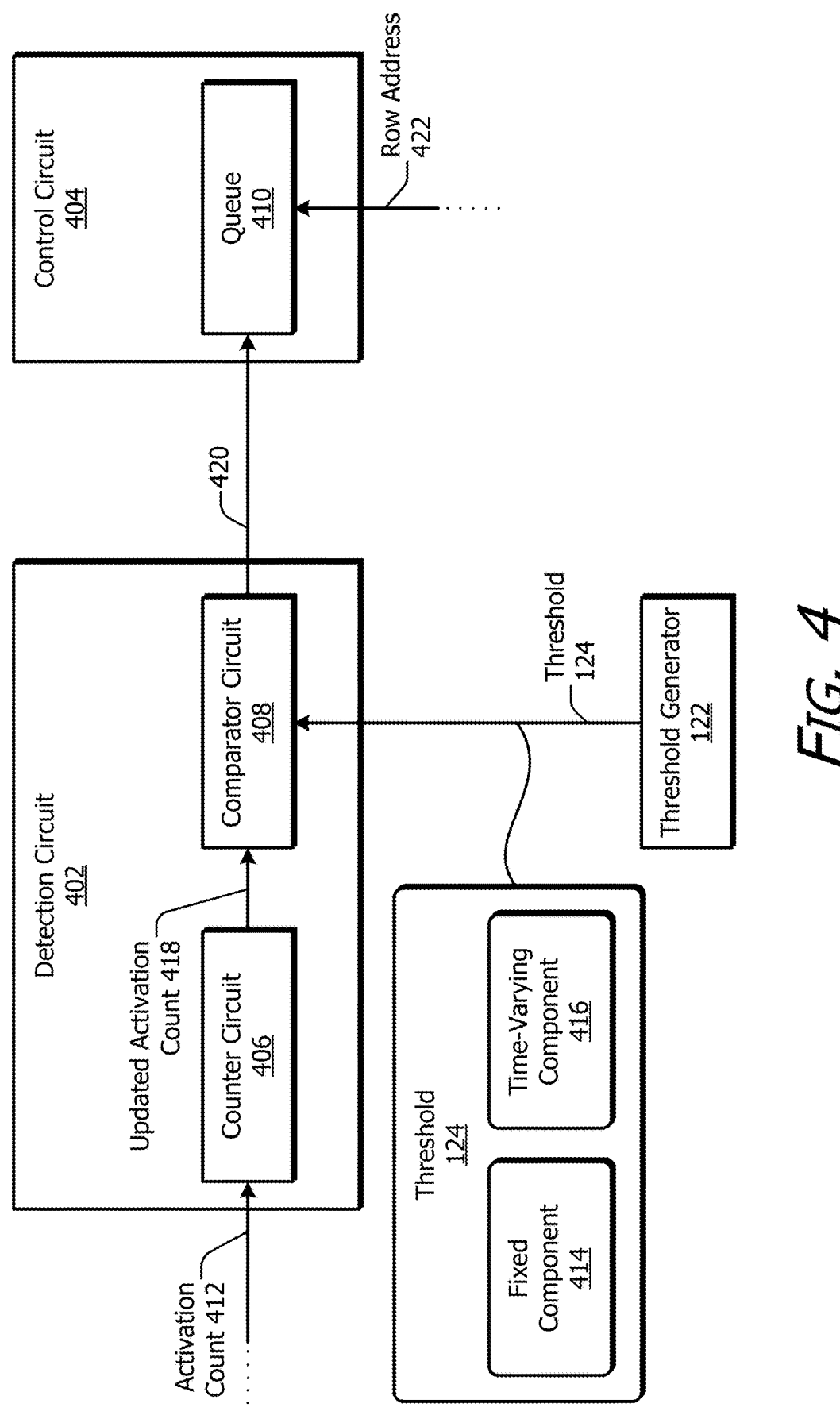
FIG. 4 illustrates example components of usage-based disturbance circuitry that can implement aspects of a time-varying threshold for usage-based disturbance mitigation.

FIG. 4 illustrates example components of the usage-based disturbance circuitry 120, which can implement aspects of a time-varying threshold for usage-based disturbance mitigation. In the depicted configuration, the usage-based disturbance circuitry 120 includes the threshold generator 122, at least one detection circuit 402, and at least one control circuit 404. The usage-based disturbance circuitry 120 can also include other components not shown in FIG. 4, such as at least one error-correction-code (ECC) circuit for detecting and/or correcting bit errors.

As shown in FIG. 4, the detection circuit 402 is coupled to the threshold generator 122 and the control circuit 404. The detection circuit 402 can also be coupled to the memory array 204. The detection circuit 402 includes at least one counter circuit 406 and at least one comparator circuit 408, which are further described below. In general, the detection circuit 402 detects conditions associated with usage-based disturbance within one or more rows of the memory array 204 based on the threshold 124 generated by the threshold generator 122. The detection circuit 402 can also update the usage-based disturbance data 214 that is stored in the memory array 204. In this way, the usage-based disturbance circuitry 120 can monitor for usage-based disturbance as the memory device 108 performs multiple memory operations over time.

The control circuit 404 can mitigate the usage-based disturbance by refreshing the one or more rows associated with the usage-based disturbance condition detected by the detection circuit 402. The control circuit 404 includes at least one queue 410, which keeps track of rows within the memory array 204 that are associated with the usage-based disturbance condition. In some implementations, the queue 410 is implemented using multiple registers. The control circuit 404 can process entries within the queue 410 based on a first-in first-out (FIFO) order. Other implementations are also possible in which the entries within the queue 410 are processed based on a last-in first-out (LIFO) order, a random order, or a priority-based order.

During operation, the memory device 108 performs a memory operation (e.g., a read or write operation) in which at least one row within the memory array 204 is activated. As part of the memory operation, the memory device 108 reads the usage-based disturbance data 214 that is stored within the memory array 204 and associated with the activated row. In this example, the usage-based disturbance data 214 includes an activation count 412, which represents a quantity of times the row associated with the memory operation has been activated. The memory device 108 provides the activation count 412 to the detection circuit 402 of the usage-based disturbance circuitry 120.

The threshold generator 122 provides the threshold 124 to the detection circuit 402. In various situations, the threshold generator 122 can generate (e.g., re-generate or update) the threshold 124 prior to providing the threshold 124 to the detection circuit 402. In some implementations, the threshold 124 represents a combination of at least one fixed component 414 (e.g., a fixed number or a base number) and at least one time-varying component 416 (e.g., a time-varying number or a random number). In general, the fixed component 414 represents a larger portion of the threshold 124 than the time-varying component 416. In example implementations, the fixed component 414 contributes more than 50% to the value of the threshold 124, such as approximately 60%, 70%, 80%, 90%, or 95%.

The fixed component 414 can have a constant value that is predetermined. A value of the fixed component 414 can be set so as to balance power efficiency with usage-based disturbance mitigation. If the fixed component 414 is too low, the usage-based disturbance circuitry 120 may refresh rows more often than necessary to mitigate usage-based disturbance, thereby wasting power. Alternatively, if the fixed component 414 is too high, the usage-based disturbance circuitry 120 may not refresh rows often enough, thereby increasing a probability of memory errors or data loss due to usage-based disturbance. To address this, the fixed component 414 is chosen such that the memory device 108 can realize the target power efficiency while refreshing rows at a sufficient rate to mitigate usage-based disturbance.

In general, the fixed component 414 does not vary over time, or at least not in an activation-dependent or time-dependent manner (not based on a quantity of activations or an amount of elapsed time). The fixed component 414 can, however, vary in a different manner than the time-varying component 416. For example, the fixed component 414 can vary based on a current operational mode of the memory device 108 (or based on an operational mode of the apparatus 102). For situations in which the memory device 108 operates in a normal-power mode, the fixed component 414 can have a first value that balances power efficiency with mitigating usage-based disturbance. Alternatively, for situations in which the memory device 108 operates in a low-power mode, the fixed component 414 can have a second value that is larger than the first value to improve power efficiency while slightly decreasing usage-based disturbance mitigation activity. A frequency at which the fixed component 414 varies is significantly less than a frequency at which the time-varying component 416 changes.

In contrast to the fixed component 414, the time-varying component 416 varies frequently over time. In some implementations, the time-varying component 416 represents a random number that can vary between a given range of numbers, such as between 0 and X, where X represents a positive integer. In general, increasing the value of X decreases a likelihood of the memory device 108 experiencing a waterfall event that causes a denial-of-service situation. Larger values of X also make it challenging for a malicious actor to identify and overcome the usage-based disturbance mitigation techniques.

The detection circuit 402 accepts the activation count 412 from the memory array 204 and the threshold 124 from the threshold generator 122. The counter circuit 406 increments the activation count 412 to generate an updated activation count 418. Although not explicitly shown, the memory device 108 can write the updated activation count 418 to the memory array 204.

The comparator circuit 408 compares the updated activation count 418 to the threshold 124 to determine whether or not a condition associated with usage-based disturbance exists. If the updated activation count 418 is less than the threshold 124, the comparator circuit 408 does not detect the condition associated with usage-based disturbance. Alternatively, if the updated activation count 418 is greater than or equal to the threshold 124, the comparator circuit 408 detects the condition associated with usage-based disturbance. In this case, the comparator circuit 408 generates a control signal 420 to indicate that the usage-based disturbance condition is detected.

The control circuit 404 accepts the control signal 420 and a row address 422 associated with the activated row. If the control signal 420 indicates that the usage-based disturbance condition is detected, the control circuit 404 adds the row address 422 to the queue 410. In this case, the row associated with the row address 422 can be referred to as an aggressor row. The control circuit 404 can cause the memory device 108 to refresh one or more rows within the memory array 204 to mitigate usage-based disturbance. These rows can be referred to as victim rows and represent rows that are proximate to, and in some instances adjacent to, the aggressor row. For example, an $R^{th}$ row of the memory array 204 can represent an aggressor row, and rows R+1, R+2, R−1, and/or R−2 can represent victim rows.

As the memory device 108 performs additional memory operations over time, the threshold generator 122 updates the threshold 124 to cause a value of the threshold 124 to change over time. Consider an example in which the memory device 108 performs a first memory operation associated with a first row. In this case, the usage-based disturbance circuitry 120 compares an activation count 412 associated with the first row to a first value of the threshold 124. During a second memory operation associated with a second row, the usage-based disturbance circuitry 120 compares an activation count 412 associated with the second row to a second value of the threshold 124, which can be greater than or less than the first value. Components that enable the threshold generator 122 to vary the threshold 124 over time are further described with respect to FIG. 5.

Figure 5:
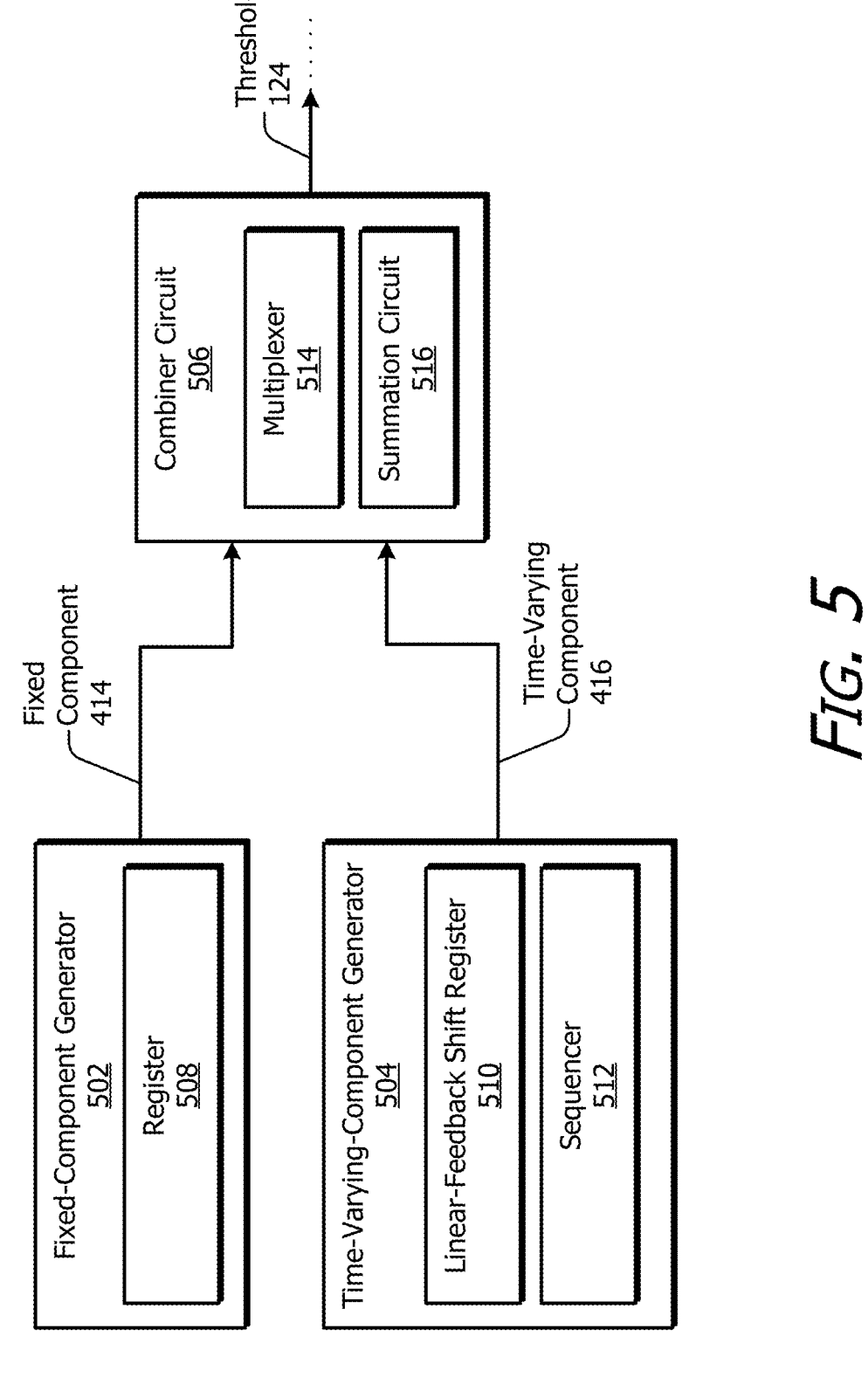
FIG. 5 illustrates an example implementation of a threshold generator that can generate a time-varying threshold for usage-based disturbance mitigation.

FIG. 5 illustrates an example implementation of the threshold generator 122 that can generate a time-varying threshold for usage-based disturbance mitigation. In the depicted configuration, the threshold generator 122 includes at least one fixed-component generator 502, at least one time-varying-component generator 504, and at least one combiner circuit 506. Inputs of the combiner circuit 506 are coupled to the fixed-component generator 502 and the time-varying-component generator 504. An output of the combiner circuit 506 is coupled to the comparator circuit 408 of FIG. 4.

The fixed-component generator 502 generates the fixed component 414. The fixed-component generator 502 can implemented using at least one register 508, which stores the fixed component 414. Generally speaking, the fixed component 414 does not vary over time. However, some implementations can adjust the fixed component 414 based on certain conditions, such as an operational mode of the memory device 108. In this case, the fixed component 414 varies significantly less frequently than the time-varying component 416.

The time-varying-component generator 504 generates the time-varying component 416. In some implementations, the time-varying-component generator 504 is implemented as a random number generator (e.g., a true random number generator or a pseudo random number generator). For example, the time-varying-component generator 504 can be implemented using a linear-feedback shift (LFSR) register 510 or a sequencer 512. Other implementations are also possible in which the time-varying-component generator 504 stores a list of available values and selects one of these values to be the time-varying component 416.

The combiner circuit 506 generates the threshold 124 based on the fixed component 414 and the time-varying component 414. More specifically, the combiner circuit 506 combines the fixed component 414 and the time-varying component 416 to generate the threshold 124. In an example implementation, the combiner circuit 506 is implemented as a multiplexer 514. In this case, the multiplexer 514 appends the time-varying component 416 to the fixed component 414 such that the fixed component 414 represents an upper portion of the threshold 124, which at least includes the most-significant bit (MSB), and the time-varying component 416 represents a lower portion of the threshold 124, which includes at least the least-significant bit (LSB).

Consider an example in which the fixed-component generator 502 generates the fixed component 414 having four bits. The time-varying-component generator 504 generates the time-varying component 416 having six bits with a binary value that can range between $(000000)_2$ and $(111111)_2$. The multiplexer 514 generates the threshold 124 such that the fixed component 414 represents the upper bits of the threshold 124 and the time-varying component 416 represents the lower bits of the threshold 124. Assuming the fixed component 414 has a binary value of $(1111)_2$ and the time-varying component 416 has a binary value of $(010101)_2$, the threshold 124 has a binary value of $(1111010101)_2$. In this example, the threshold 124 can vary over time between a decimal value of 960 and 1023 as the value of the time-varying component 416 varies between decimal values of 0 and 63. In this case, the fixed component 414 can represent between approximately 93% to 100% a value of the threshold 124 depending on the value of the time-varying component 416.

In another example implementation, the combiner circuit 506 is implemented as a summation circuit 516 (or a multi-bit adder). In this case, the summation circuit 516 adds the fixed component 414 and the time-varying component 416 together to generate the threshold 124. Other implementations of the combiner circuit 506 are also possible. In general, the threshold generator 122 generates the threshold 124 in such a way that the fixed component 414 represents a larger portion of the threshold 124 than the time-varying component 416.

The threshold generator 122 can be implemented using components that do not significantly increase a size or cost of the memory device 108. In this way, the techniques for generating and utilizing a time-varying threshold for usage-based disturbance mitigation can be readily implemented. To reduce a risk of a waterfall event causing a denial-of-service situation, the threshold generator 122 can generate (e.g., re-generate or update) the threshold 124 in various manners, as further described with respect to FIGS. 6 and 7.

Figure 6:
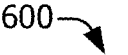
FIG. 6 illustrates an example flow diagram for performing aspects of generating a time-varying threshold for usage-based disturbance mitigation.
Figure 6:
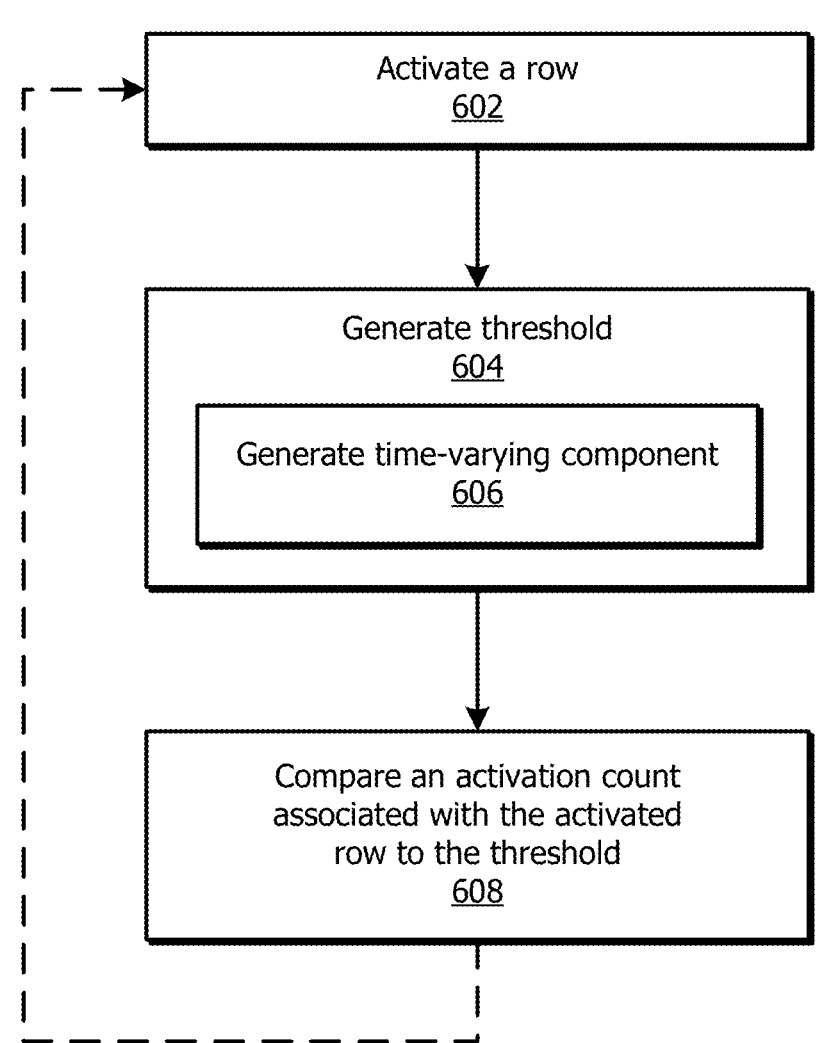

FIG. 6 illustrates an example flow diagram 600 for performing aspects of generating a time-varying threshold for usage-based disturbance mitigation. In this example flow diagram 600, the threshold generator 122 varies the threshold 124 (e.g., generates a new time-varying component 416) for each memory operation (e.g., for each row that is activated within the memory array 204). At 602, the memory device 108 activates a row within the memory array 204. In particular, the memory device 108 can activate a row within the memory array 204 as part of a read or write operation.

At 604, the threshold generator 122 generates the threshold 124. In particular, the time-varying-component generator 504 generates the time-varying component 416 at 606. If the time-varying component 416 was previously generated, the operation at 606 causes a value of the time-varying component 416 to differ from the previous value. This causes the threshold 124 to vary over time. In some implementations, the threshold generator 122 generates the threshold 124 based on an activate command, a read or write command, or a precharge command that is received by the memory device 108 from the memory controller 114. At 608, the detection circuit 402 compares an activation count 412 that is associated with the activated row to the threshold 124.

The set of operations described in 600 can be repeated for subsequent memory operations. In this manner, the threshold 124 varies over time as the memory device 108 performs multiple activations on a same row or different rows. In this case, the threshold 124 can vary for each activation. In other implementations, the threshold 124 can vary less frequently, as further described with respect to FIG. 7.

FIG. 7 illustrates another example flow diagram 700 for performing aspects of generating a time-varying threshold for usage-based disturbance mitigation. In this example flow diagram 700, the threshold generator 122 varies the threshold 124 (e.g., generates a new time-varying component 416) if a particular condition is met. Consequently, the threshold 708 is updated less frequently compared to the implementation described with respect to the flow diagram of 600. For instance, the threshold 124 can remain the same as the memory device 108 performs at least two memory operations.

At 702, the memory device 108 activates a row within the memory array 204. In particular, the memory device 108 can activate a row within the memory array 204 as part of a read or write operation.

At 704, the threshold generator 122 determines whether or not a condition is met to generate the threshold 124. If the condition is not met, the threshold generator 122 does not change a value of the threshold 124, and the previously-generated threshold 124 is provided to the comparator circuit 408. At 706, the detection circuit 402 compares an activation count that is associated with the activated row to the threshold 124 (e.g., the previously-generated threshold).

Alternatively, if the condition is met at 704, the threshold generator 122 generates (e.g., re-generates or updates) the threshold 124 such that a value of the threshold 124 varies from a previously-used value, as indicated at 708. In particular, the time-varying component generator 504 generates (e.g., re-generates or updates) the time-varying component 416 at 710.

The threshold generator 122 can evaluate various conditions to determine whether or not to update (e.g., change or re-generate) the threshold 124. The condition can be frequency-based or time-based. In an example implementation, the threshold generator 122 maintains an activation-frequency count, which represents a quantity of row activations (at 702) that occur after the threshold 124 was generated at 708. In this case, the threshold generator 122 increments the activation-frequency count at 704.

To evaluate this frequency-based condition at 704, the threshold generator 122 compares the activation-frequency count to a threshold. The threshold used to evaluate the activation-frequency count can be predetermined to balance power efficiency while mitigating usage-based disturbance. Increasing the threshold can enable the memory device 108 to conserve power at the cost of increasing a probability of a waterfall event causing a denial-of-service situation. Decreasing the threshold can decrease a probability of a waterfall event causing a denial-of-service situation at the cost of increasing power consumption of the memory device 108.

At 704, the condition is not met if the activation-frequency count is less than the threshold. In this case, the flow diagram 700 proceeds directly from 704 to 706. Alternatively, if the activation-frequency count is greater than or equal to the threshold, the condition at 704 is met, and the flow diagram 700 proceeds from 704 to 708 and proceeds from 708 to 706. At 708, the threshold generator 122 can reset the activation-frequency count to zero.

Consider an example in which the condition at 704 causes the threshold generator 122 to update the threshold 124 every other activation or every three activations. In this case, the threshold 124 remains the same for two or three consecutive activations (e.g., for two or three iterations of the flow diagram 700).

In another example implementation, the threshold generator 122 maintains a timer, which keeps track of the amount of time that has elapsed since the threshold 124 was generated at 708. At 704, the threshold generator 122 determines whether or not the timer has expired. If the timer has not expired, the flow diagram 700 proceeds directly from 704 to 706. Alternatively, if the timer has expired, the flow diagram 700 proceeds from 704 to 708 and proceeds from 708 to 706. At 708, the threshold generator 122 can reset the timer.

Example Method

Figure 8:
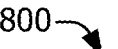
FIG. 8 illustrates an example method for a memory device performing aspects of generating a time-varying threshold for usage-based disturbance mitigation.

This section describes an example method for implementing aspects of a time-varying threshold for usage-based disturbance mitigation with reference to the flow diagram of FIG. 8. These descriptions may also refer to components, entities, and other aspects depicted in FIGS. 1 to 7 by way of example only. The described methods are not necessarily limited to performance by one entity or multiple entities operating on one device.

FIG. 8 illustrates a method 800, which includes operations 802 through 806. In aspects, operations of the method 800 are implemented by a memory device 108 as described with reference to FIG. 1. At 802, a memory array stores an activation count that represents a quantity of times a row within the memory array has been activated. For example, the memory array 204 of FIG. 2 stores the activation count 412, which represents a quantity of times a corresponding row within the memory array 204 has been activated. The activation count 412 can be stored as part of the usage-based disturbance data 214 shown in FIG. 2. In some implementations, a subset of memory cells within each row of the memory array 204 stores an activation count 412 associated with the corresponding row.

At 804, a threshold that varies over time is generated by circuitry. For example, the usage-based disturbance circuitry 120 (e.g., the threshold generator 122) generates the threshold 124, as shown in FIG. 4. The threshold 124 varies over time. In some implementations, the threshold 124 is updated every time the memory device 108 activates a row, as described with respect to FIG. 6. In other implementations, the threshold 124 is updated based on a frequency-based or time-based condition, as described with respect to FIG. 7. The threshold generator 122 generates the threshold 124 based on a fixed component 414 and a time-varying component 416, as shown in FIGS. 4 and 5. In general, the fixed component 414 represents a larger portion of the threshold 124 compared to the time-varying component 416.

At 806, a condition associated with usage-based disturbance is detected by the circuitry based on the activation count being greater than or equal to the threshold. For example, the usage-based disturbance circuitry 120 detects a condition associated with usage-based disturbance based on the activation count 412 being greater than or equal to the threshold 124. By using the time-varying threshold 124 instead of a fixed threshold to detect the condition associated with usage-based disturbance, the memory device 108 can decrease a probability of a waterfall event causing a denial-of-service situation by spreading out the refreshing of rows over a longer time period.

For the figures described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1 to 6, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

In the following, various examples for implementing aspects of a time-varying threshold for usage-based disturbance mitigation are described:

Example 1: An apparatus comprising:

a memory device comprising:

a memory array configured to store an activation count that represents a quantity of times a row within the memory array has been activated; and circuitry that is coupled to the memory array and configured to detect a condition associated with usage-based disturbance based on the activation count being greater than or equal to a threshold that varies over time.

Example 2: The apparatus of example 1 or any other example, wherein the threshold is at least partially randomized.

Example 3: The apparatus of example 1 or any other example, wherein the circuitry is configured to generate the threshold based on a fixed component and a time-varying component.

Example 4: The apparatus of example 3 or any other example, wherein the circuitry comprises:

at least one register configured to store a value associated with the fixed component; and at least one linear-feedback shift register or at least one sequencer configured to generate the time-varying component.

Example 5: The apparatus of example 3 or any other example, wherein the fixed component represents a larger portion of the threshold than the time-varying component.

Example 6: The apparatus of example 5 or any other example, wherein:

the threshold comprises:

an upper portion comprising at least a most-significant bit; and a lower portion comprising at least a least-significant bit; and the circuitry comprises a multiplexer configured to combine the fixed component and the time-varying component such that the fixed component represents the upper portion of the threshold and the time-varying component represents the lower portion of the threshold.

Example 7: The apparatus of example 5 or any other example, wherein:

the fixed component represents a first positive integer;

the circuitry is configured to generate the time-varying component having a value between zero and a second positive integer, the second positive integer being less than the first positive integer; and the circuitry comprises a summation circuit configured to add the fixed component and the time-varying component to generate the threshold.

Example 8: The apparatus of example 1 or any other example, wherein the memory array comprises multiple rows respectively configured to store multiple activation counts corresponding to the multiple rows.

Example 9: A method comprising:

storing, by a memory array, an activation count that represents a quantity of times a row within the memory array has been activated;

generating, by circuitry, a threshold that varies over time; and detecting, by the circuitry, a condition associated with usage-based disturbance based on the activation count being greater than or equal to the threshold.

Example 10: The method of example 9 or any other example, wherein:

the generating of the threshold comprises generating the threshold based on a fixed component and a time-varying component; and the fixed component represents a larger portion of the threshold than the time-varying component.

Example 11: The method of example 10 or any other example, wherein the threshold comprises:

an upper portion comprising at least a most-significant bit; and a lower portion comprising at least a least-significant bit; and the generating of the threshold comprises combining the fixed component and the time-varying component such that the fixed component represents the upper portion of the threshold and the time-varying component represents the lower portion of the threshold.

Example 12: The method of example 10 or any other example, wherein the generating of the threshold comprises:

generating the fixed component to have a value equal to a first positive integer;

generating the time-varying component to have a value between zero and a second positive integer that is less than the first positive integer; and adding the fixed component and the time-varying component to generate the threshold.

Example 13: The method of example 9 or any other example, further comprising:

storing, by the memory array, a second activation count that represents a quantity of times a second row within the memory array has been activated; and detecting, by the circuitry, a condition associated with the usage-based disturbance based on the second activation count being greater than or equal to the threshold.

Example 14: The method of example 13 or any other example, wherein:

the generating of the threshold comprises generating the threshold to have a first value; and the method further comprises:

prior to detecting the condition associated with the usage-based disturbance based on the second activation count being greater than or equal to the threshold, updating the threshold to have a second value that differs from the first value.

Example 15: The method of example 14 or any other example, further comprising:

activating, by a memory device, multiple rows within the memory array, the multiple rows including the row and the second row, wherein the updating of the threshold comprises updating the threshold responsive to a quantity of activations since the generating of the threshold and the activating of the second row being greater than or equal to a threshold.

Example 16: The method of example 14 or any other example, further comprising:

starting a timer responsive to the generating of the threshold, wherein the updating of the threshold comprises updating the threshold responsive to an expiration of the timer.

Example 17: An apparatus comprising:

a memory device comprising:

a threshold generator configured to generate a threshold that is at least partially randomized;

a counter circuit configured to increment an activation count associated with a row that is activated within a memory array of the memory device; and a comparator circuit coupled to the threshold generator and the counter circuit, the comparator circuit configured to compare the activation count to the threshold to detect a condition associated with usage-based disturbance.

Example 18: The apparatus of example 17 or any other example, wherein:

the threshold generator is configured to generate the threshold based on a fixed component and a time-varying component; and the fixed component represents a larger portion of the threshold than the time-varying component.

Example 19: The apparatus of example 18 or any other example, wherein the threshold generator comprises:

at least one register configured to store a value associated with the fixed component; and at least one random number generator configured to generate the time-varying component.

Example 20: The apparatus of example 19 or any other example, wherein:

the threshold generator comprises a combiner circuit having:

inputs coupled to the at least one register and the random number generator; and an output coupled to the comparator circuit; and the combiner circuit comprises a multiplexer or a summation circuit.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although aspects of implementing aspects of a time-varying threshold for usage-based disturbance mitigation have been described in language specific to certain features and/or methods, the subject of the appended claims is not necessarily limited to the specific features or methods described. Rather, the specific features and methods are disclosed as a variety of example implementations of implementing aspects of a time-varying threshold for usage-based disturbance mitigation.

What is claimed is:

1. An apparatus comprising:
a memory device comprising:
   a memory array configured to store an activation count that represents a quantity of times a row within the memory array has been activated; and
   circuitry that is coupled to the memory array and configured to detect a condition associated with usage-based disturbance based on the activation count being greater than or equal to a threshold, the threshold being at least partially randomized such that a value of the threshold varies over time.

2. The apparatus of claim 1, wherein the circuitry is configured to select the threshold from a table of values.

3. The apparatus of claim 1, wherein the circuitry is configured to generate the threshold based on a fixed component and a time-varying component.

4. The apparatus of claim 3, wherein the circuitry comprises:
at least one register configured to store a value associated with the fixed component; and
at least one linear-feedback shift register or at least one sequencer configured to generate the time-varying component.

5. The apparatus of claim 3, wherein the fixed component represents a larger portion of the threshold than the time-varying component.

6. The apparatus of claim 5, wherein:
the threshold comprises:
   an upper portion comprising at least a most-significant bit; and
   a lower portion comprising at least a least-significant bit; and
the circuitry comprises a multiplexer configured to combine the fixed component and the time-varying component such that the fixed component represents the upper portion of the threshold and the time-varying component represents the lower portion of the threshold.

7. The apparatus of claim 5, wherein:
the fixed component represents a first positive integer;
the circuitry is configured to generate the time-varying component having a value between zero and a second positive integer, the second positive integer being less than the first positive integer; and
the circuitry comprises a summation circuit configured to add the fixed component and the time-varying component to generate the threshold.

8. The apparatus of claim 1, wherein the memory array comprises multiple rows respectively configured to store multiple activation counts corresponding to the multiple rows.

9. A method comprising:
storing, by a memory array, an activation count that represents a quantity of times a row within the memory array has been activated;
generating, by circuitry, a threshold that is at least partially randomized such that a value of the threshold varies over time; and
detecting, by the circuitry, a condition associated with usage-based disturbance based on the activation count being greater than or equal to the threshold.

10. The method of claim 9, wherein:
the generating of the threshold comprises generating the threshold based on a fixed component and a time-varying component; and
the fixed component represents a larger portion of the threshold than the time-varying component.

11. The method of claim 10, wherein
the threshold comprises:
   an upper portion comprising at least a most-significant bit; and
   a lower portion comprising at least a least-significant bit; and
the generating of the threshold comprises combining the fixed component and the time-varying component such that the fixed component represents the upper portion of the threshold and the time-varying component represents the lower portion of the threshold.

12. The method of claim 10, wherein the generating of the threshold comprises:
generating the fixed component to have a value equal to a first positive integer;
generating the time-varying component to have a value between zero and a second positive integer that is less than the first positive integer; and
adding the fixed component and the time-varying component to generate the threshold.

13. The method of claim 9, further comprising:
storing, by the memory array, a second activation count that represents a quantity of times a second row within the memory array has been activated; and
detecting, by the circuitry, a condition associated with the usage-based disturbance based on the second activation count being greater than or equal to the threshold.

14. The method of claim 13, wherein:
the generating of the threshold comprises generating the threshold to have a first value; and
the method further comprises:
   prior to detecting the condition associated with the usage-based disturbance based on the second activation count being greater than or equal to the threshold, updating the threshold to have a second value that differs from the first value.

15. The method of claim 14, further comprising:
activating, by a memory device, multiple rows within the memory array, the multiple rows including the row and the second row, wherein the updating of the threshold comprises updating the threshold responsive to a quantity of activations since the generating of the threshold being greater than or equal to a threshold.

16. The method of claim 14, further comprising:

starting a timer responsive to the generating of the threshold, wherein the updating of the threshold comprises updating the threshold responsive to an expiration of the timer.

17. An apparatus comprising:

a memory device comprising:

a threshold generator configured to generate a threshold that is at least partially randomized such that a value of the threshold varies over time;

a counter circuit configured to increment an activation count associated with a row that is activated within a memory array of the memory device; and a comparator circuit coupled to the threshold generator and the counter circuit, the comparator circuit configured to compare the activation count to the threshold to detect a condition associated with usage-based disturbance.

18. The apparatus of claim 17, wherein:

the threshold generator is configured to generate the threshold based on a fixed component and a time-varying component; and the fixed component represents a larger portion of the threshold than the time-varying component.

19. The apparatus of claim 18, wherein the threshold generator comprises:

at least one register configured to store a value associated with the fixed component; and at least one random number generator configured to generate the time-varying component.

20. The apparatus of claim 19, wherein:

the threshold generator comprises a combiner circuit having:

inputs respectively coupled to the at least one register and the random number generator; and an output coupled to the comparator circuit; and the combiner circuit comprises a multiplexer or a summation circuit.

* * * * *